(12) United States Patent
Kurisu

(10) Patent No.: US 6,750,151 B2
(45) Date of Patent: Jun. 15, 2004

(54) ETCHING METHOD FOR ZNSE POLYCRYSTALLINE SUBSTRATE

(75) Inventor: Kenichi Kurisu, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/993,223

(22) Filed: Nov. 26, 2001

(65) Prior Publication Data

US 2002/0081857 A1 Jun. 27, 2002

(30) Foreign Application Priority Data

Dec. 27, 2000 (JP) ........................................ 2000-397640

(51) Int. Cl.⁷ ............................................ H01L 21/302
(52) U.S. Cl. ........................ 438/706; 438/710; 438/712; 438/720; 216/58
(58) Field of Search ................................ 438/706, 710, 438/712, 720, 714; 156/345; 216/58, 75, 79, 80

(56) References Cited

U.S. PATENT DOCUMENTS

| | | | | |
|---|---|---|---|---|
| 5,173,443 A | * | 12/1992 | Biricik et al. ................ | 438/181 |
| 5,351,255 A | * | 9/1994 | Schetzina ..................... | 372/45 |
| 5,475,237 A | * | 12/1995 | Narui et al. ................... | 257/22 |
| 5,635,021 A | * | 6/1997 | Harafuji ....................... | 438/714 |
| 5,707,486 A | * | 1/1998 | Collins ......................... | 156/345 |
| 5,776,793 A | * | 7/1998 | Lee et al. ...................... | 438/35 |
| 6,037,267 A | * | 3/2000 | Kim et al. .................... | 438/720 |

FOREIGN PATENT DOCUMENTS

| | | |
|---|---|---|
| JP | 02299227 | 12/1990 |
| JP | 04042984 | 2/1992 |
| JP | 07335620 | 12/1995 |

OTHER PUBLICATIONS

"Treatment of ZnSe substrates for homoepitaxy", Ohkawa et al., *J. Vac. Sci. Technol. B.* vol. 9, No. 4, Jul./Aug. 1991.

* cited by examiner

Primary Examiner—Lan Vinh
(74) Attorney, Agent, or Firm—McDermott, Will & Emery

(57) ABSTRACT

When applying reactive ion etching on a ZnSe polycrystalline substrate, reactive gas used therefor is only chlorine-based gas which does not include a hydrocarbon group. Or the reactive gas is gas prepared by mixing chlorine-based gas which does not include a hydrocarbon group with other gas. The other gas is inert gas or gas which does not react to ZnSe. $BCl_3$ gas is one kind of chlorine-based gas. Ar gas is one kind of inert gas. RF power is one means for activating the gas.

13 Claims, 9 Drawing Sheets

ETCHING METHOD FOR ZNSE POLYCRYSTALLINE SUBSTRATE

BACKGROUND OF THE INVENTION

1. Field of the Invention

The present invention relates, in general, to an etching method for a zinc selenide (ZnSe) polycrystalline substrate. In particular, it relates to an etching method for a ZnSe polycrystalline substrate whereby a smoothly etched surface can be obtained.

2. Description of the Background Art

With the miniaturization of electronic components and electronic devices used in mobile telephones, personal computers, etc., there has been increasing demand for finer and higher speed drill processing. The application of a diffractive optical element (DOE) has been promoted as a key device to satisfy this demand.

Unlike conventional optical components utilizing refraction and/or reflection, the DOE utilizes optical diffraction and directly controls the phases, thereby becoming an optical component, of which a wide range of applications including, beam splitting, for example, can be expected FIG. 9 shows an example wherein the DOE is utilized in drill processing using a carbon dioxide gas laser. Use of the DOE makes it possible to split one processing laser beam into multiple spots and simultaneously drill a plurality of holes, thus realizing high-speed processing of minute holes. Application examples of the DOE to other laser processing are shown in FIG. 10. ZnSe is excellent in infrared transmittance and is used as material of optical elements for a carbon dioxide gas laser. In general, as for ZuSe having a diameter of 1 or 2 inches and a thickness of several millimeters, which is commonly used as an optical element, that of polycrystal is used as opposed to that of single crystal in consideration of cost. In most cases, high purity ZnSe polycrystals synthesized by a chemical vapor disposition (CVD) method are used.

FIG. 8 is a diagram showing the general steps for manufacturing a DOE using ZnSe polycrystals.

Step A: Synthesizing a ZnSe polycrystal from Zn and $H_2Se$.

Step B: Cutting the ZnSe polycrystal, forming a ZnSe polycrystalline substrate 1, and polishing the surface thereof Step C: Forming a resist layer 2 on the ZnSe polycrystalline substrate 1.

Step D: Selectively irradiating light 4 by means of a photomask 3 and forming a printed pattern on the resist layer 2.

Step D and Step E: Developing the resist layer 2 and forming a resist pattern 5.

Step F: Performing reactive ion etching (RIE) for the ZnSe polycrystalline substrate 1 by means of the resist pattern 5 and forming a pattern 1a on the substrate 1.

Step G: Removing the resist pattern 5.

Step H: Forming an anti-reflection (AR) coating layer 6 on the ZnSe polycrystalline substrate 1.

By the RIE method used in step F of FIG. 8, a chemical reaction occurs between radicals generated from the reactive gas and ZnSe on the substrate surface, generating by-products. These by-products are then removed by sputtering. Thus the etching progresses.

Hydrocarbon-based gas, which is commonly used for a signal crystal, is known as etching gas of the RIB method.

However, if hydrocarbon-based gas is used as the etching gas, the etching rate depends heavily on the crystal direction of the polycrystal grains. As a result, as shown in FIG. 12, the surface of the ZnSe polycrystal becomes rough, deteriorating the optical characteristics of the DOE.

It is assumed that, owing to the mechanism shown in FIG. 11, the etching rate depends heavily on the crystal direction of the polycrystal grains in the case where hydrocarbon-based gas is used as the etching gas.

When the hydrocarbon-based gas is used, the gas reacts with the ZnSe at the substrate surface and generates by-products of metal-organic compounds such as dimethylzine, dimethylselenide and the like. They have a high vapor pressure and a strong tendency to desorb from the substrate surface simultaneously with the generation. And the ratio to be removed by sputtering is small. Namely, the etching rate greatly depends on the reaction between the radicals and ZnSe on the substrate surface.

With respect to polycrystals, atomic density on the forefront surface is different depending on the crystal direction of the crystal grains, while the radicals generated from the reactive etching gas uniformly reach the surface. As a result, etching progresses slowly for a crystal grain having a high atomic density on the surface compared to a crystal grain having a low atomic density. Since the etching rate is different depending on the crystal direction of the crystal grains, unevenness is created among individual crystal grains after etching.

SUMMARY OF THE INVENTION

The present invention provides an etching method for a ZnSe polycrystalline substrate which has been improved so that a smoothly etched surface can be obtained.

According to the present invention, a ZnSe polycrystalline substrate is etched by a reactive ion etching method by means of chlorine-based gas which does not include a hydrocarbon group $BCl_3$ gas is preferably used as the chlorine-based gas. In addition, inert gas or gas that does not react to ZnSe may be mixed in the above chlorine-based gas. Ar gas can be used as the inert gas. Furthermore, the above-described reactive ion etching is preferably performed at 0.5 Pa through 1 Pa. Radio frequency (RF) power can be utilized for activating the gas.

DETAILED DESCRIPTION OF THE INVENTION

Hereinafter, an embodiment of the present invention will be described in detail.

Referring to FIG. 1(A), a ZnSe polycrystalline substrate (diameter: 2 inches and thickness: 5 mm) 1 formed by the CVD method is prepared. The ZnSe polycrystalline substrate 1 was etched by the RIE method Etching conditions included a pressure of 0.8 Pa, a $BCl_3$ flow rate of 5 sccm, RF power of 90 W, and an etching time of 90 minutes. The etching depth was approximately 4 $\mu$m. A condition of the etched surface is shown in FIG. 2. The surface roughness (Ra) was 5 nm.

The surface uniformity of the surface condition of the ZnSe polycrystalline substrate thus obtained by the embodiment of the present invention was 3.1%. Referring to FIG. 7, the surface uniformity is defined by the following equation based on the etched depths of four points located at 5 mm from the outer circumference of the 2-inch substrate and one central point thereof.

Surface uniformity={(Maximum depth value)−(Minimum depth value)}/{(Maximum depth value)+(Minimum depth value)}

That such a smooth surface can be obtained by the present embodiment Can be understood as follows.

Referring to FIGS. 1(A) and (B), when reactive ion etching is performed on the ZnSe polycrystalline substrate 1 by means of chlorine-based gas such as $BCl_3$ or the like, first, by-products 7 such as $ZnCl_2$, $SE_2Cl_2$, $SeCl_4$, and the like, which are low in vapor pressure, are generated. Since these chlorides are low in vapor pressure, they do not desorb immediately but move around the surface of the ZnSe polycrystalline substrate 1 and are uniformly distributed. (See FIGS. 1(B) and (C).)

Then, referring to FIGS. 1(D) and (E), sputtering ions (positive ions) remove the by-products 7 and a new surface of the ZnSe polycrystalline substrate 1 appears.

The operations of FIG. 1(A) through FIG. 1(E) are repeated and the surface of the ZnSe polycrystalline substrate 1 is gradually etched Accordingly, the surface of the ZnSe polycrystalline substrate 1 is uniformly etched independent of the crystal direction of the crystal grains, thus a smooth surface can be obtained.

Furthermore, if Ar gas and the like is mixed in the gas used for the etching, heavy ionized grains effectively sputter and remove the bi-products.

In addition, if the reactive ion etching is performed at a gas pressure of 0.5 Pa through 1 Pa, removal of the by-products within the surface is unified and the uniformity of the etching speed within the substrate surface is enhanced.

By way of comparison, etching is also performed by a method according to the prior art. Namely, a ZnSe polycrystal, which is formed by the same method as the embodiment of the present invention, is etched by using methane gas as the reactive gas.

Etching conditions included a $CH_4$ flow rate of 5 sccm, a pressure of 1 Pa, and RF power of 0.5 W/cm², the etching time was 180 minutes, and the etching depth was approximately 41 μm. A condition of the etched surface in this case is as shown in FIG. 12. The surface roughness (Ra) was 80 nm and the surface was not a mirror surface.

Hereinafter, the relationship between the etching conditions in the embodiment of the present invention and characteristics of the etched surface thus obtained will be described.

1. Relationship Between the Gas Pressure and Surface Roughness:

In FIG. 3, the relationship between the gas pressure and surface roughness by the etching method for a ZnSe polycrystalline substrate according to the present invention is shown. At an equivalent gas pressure, other conditions were varied for carrying out each experiment, and the results were plotted in the diagram. As can be understood from FIG. 3, there was not a heavy dependence between the gas pressure and surface roughness.

2. Relationship Between the Radio Frequency (RF) Power and Surface Roughness:

FIG. 4 is a diagram showing the relationship between the radio frequency (RF) power and surface roughness. As can be understood from FIG. 4, it was possible to obtain the most preferable surface roughness in the vicinity of a radio frequency power of 0.45 W/cm².

3. Relationship Between the $BCl_3$ Flow Rate and Surface Roughness:

FIG. 5 is a diagram showing the relationship between the $BCl_3$ flow rate and surface roughness. As can be understood from FIG. 5, the dependency between the $BCl_3$ flow rate and surface roughness was minimal.

4. Relationship Between the Pressure and Surface Uniformity:

Next, the relationship between the pressure and surface uniformity will be explained. FIG. 6 shows the relationship between the pressure and surface uniformity. As can be understood from FIG. 6, the lower the pressure, the more preferable the surface uniformity was. However, in the low-pressure area of 0.5 Pa or below, plasma did not stably generate and etching could not be performed.

It can be considered that a smoothly etched surface can be obtained due to a low vapor pressure of by-products which are presumed to be generated by the $BCl_3$ gas. In terms of the boiling point of each product, the boiling point of $ZnCl_2$ is 753° C., $Se_2Cl_2$, 130° C., and $SeCl_4$, 305° C. On the other hand, the boiling point of $(CH_3)_2Zn$ is 44° C., and $(CH_3)_2Se$, 55° C., which are et by-products presumed to be generated when etching is performed using methane gas.

It should be understood that the embodiment herein disclosed is an illustration in all aspects, and therefore has no limitation. The scope of the present invention is not indicated by the foregoing descriptions but by the scope of the claims of the invention and it is intended to include therein equivalents of the claims of the invention and all modifications within the scope thereof

Figure 1:
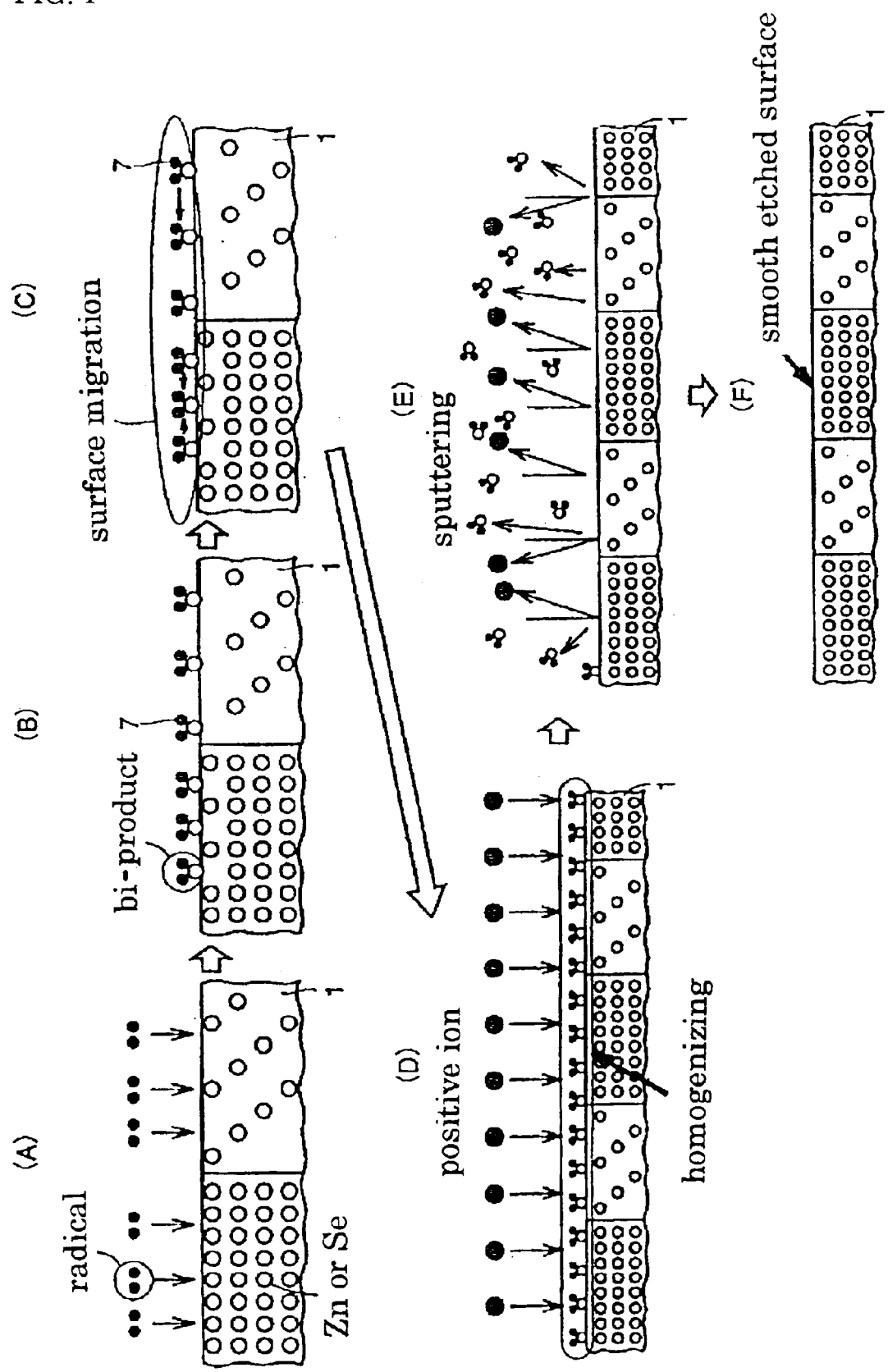
FIG. 1 is a view showing an assumable mechanism of the etching using $BCl_3$ gas according to the embodiment of the present invention.
Figure 2:
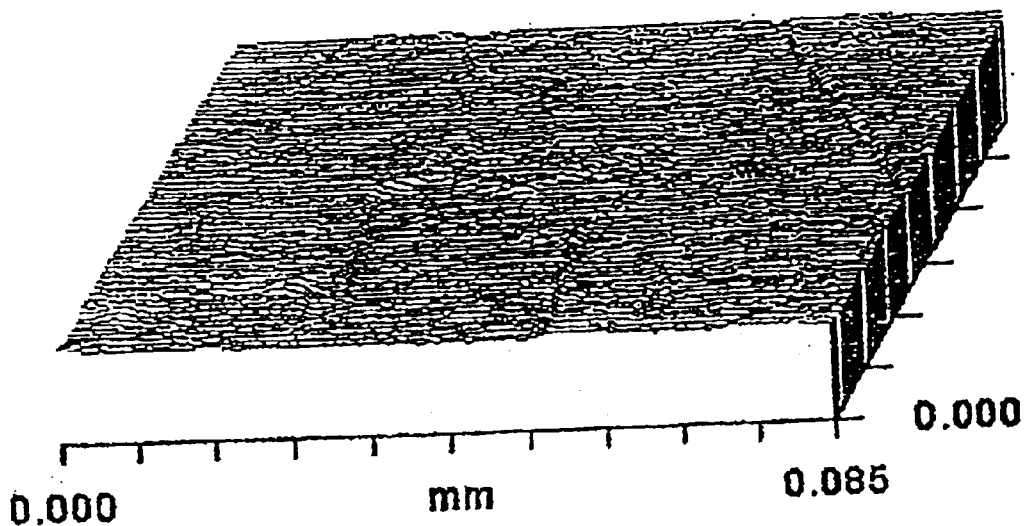
FIG. 2 is a view showing an etched surface condition obtained by the embodiment of the present invention.
Figure 3:
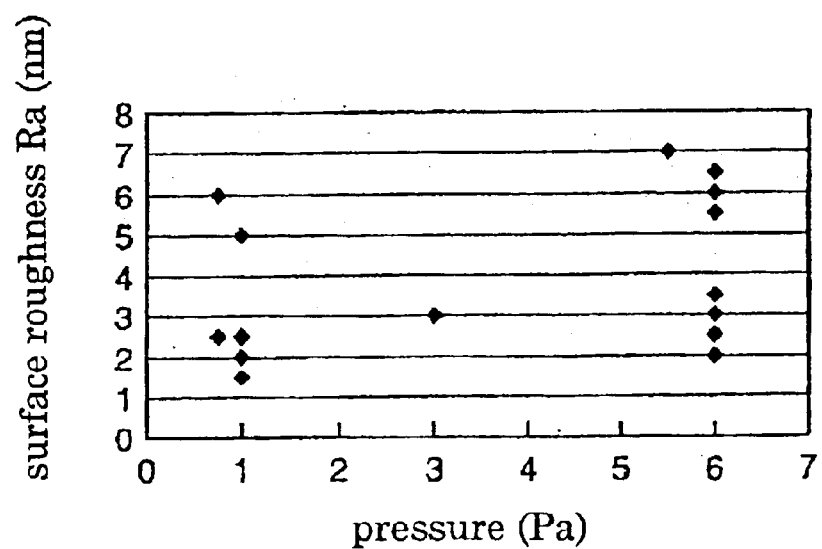
FIG. 3 is a diagram showing the relationship between the gas pressure and etched surface roughness of the present invention.
Figure 4:
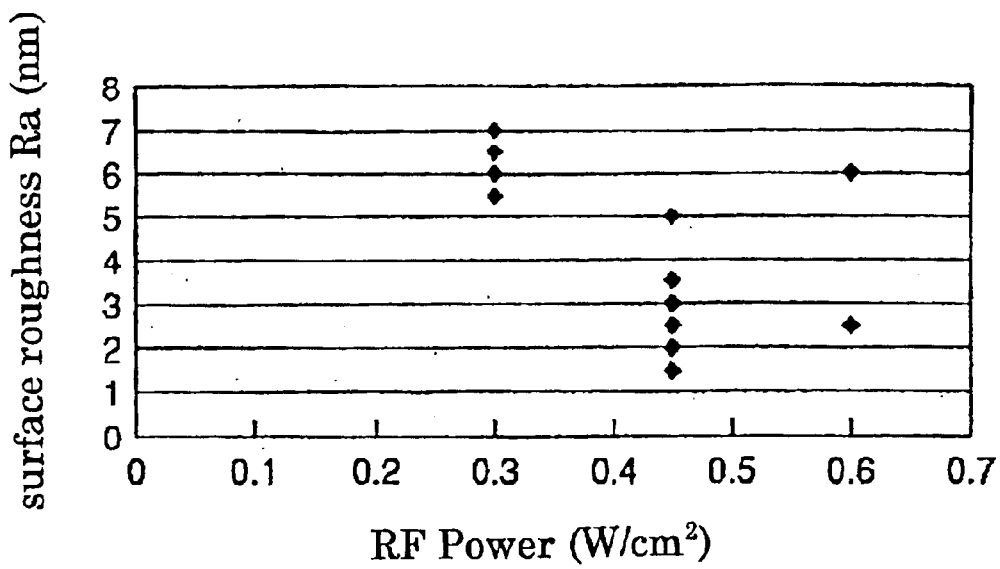
FIG. 4 is a diagram showing the relationship between the charged radio frequency power and etched surface roughness of the present invention
Figure 5:
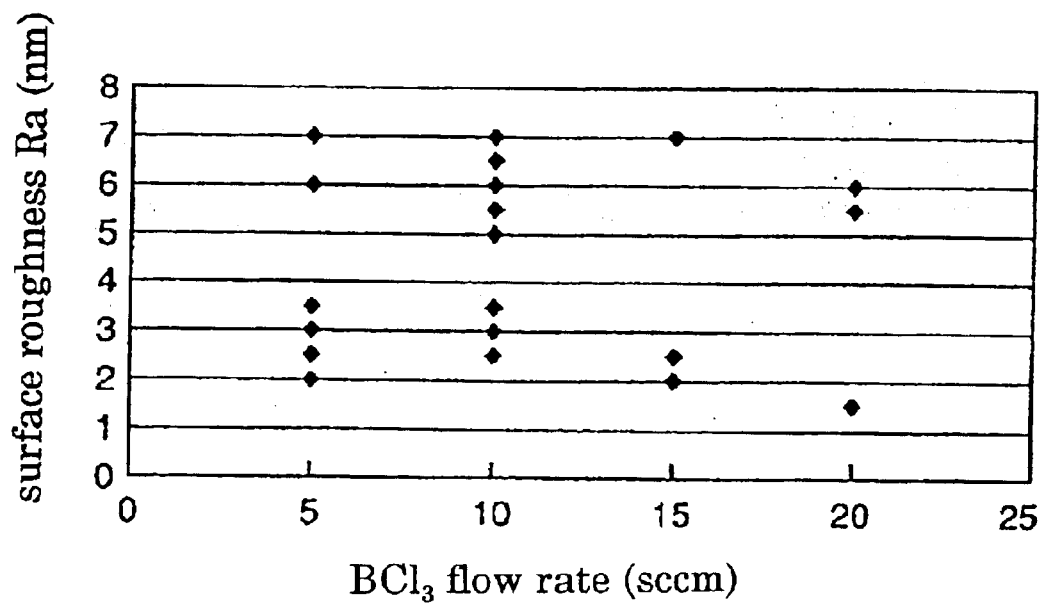
FIG. 5 is a diagram showing the relationship between the $BCl_3$ flow rate and etched surface roughness of the present invention.
Figure 6:
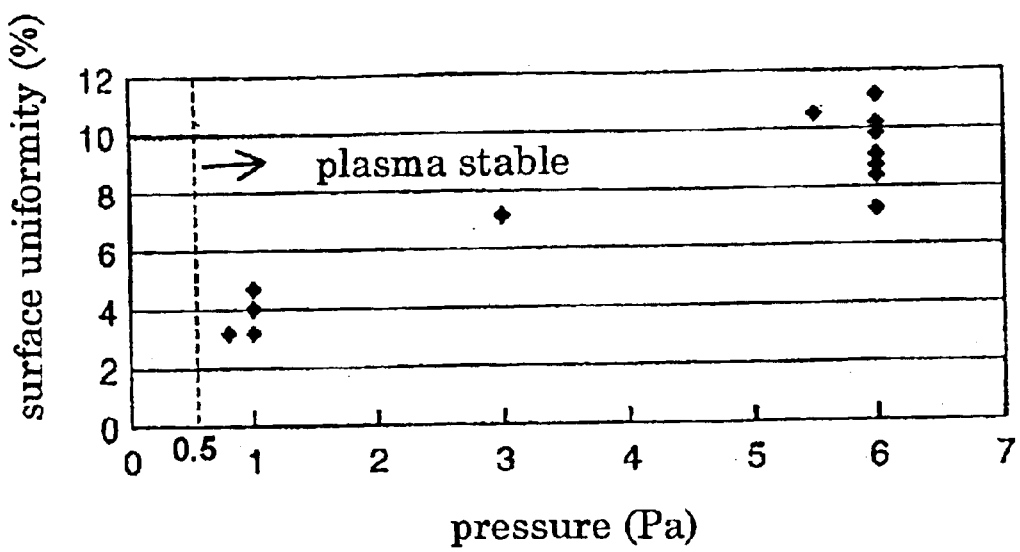
FIG. 6 is a diagram showing the relationship between the pressure and surface uniformity of the present invention.
Figure 7:
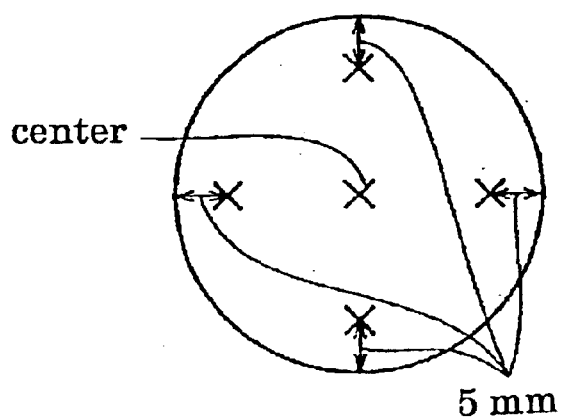
FIG. 7 is a diagram showing measuring positions on the surface when surface uniformity is determined.
Figure 8:
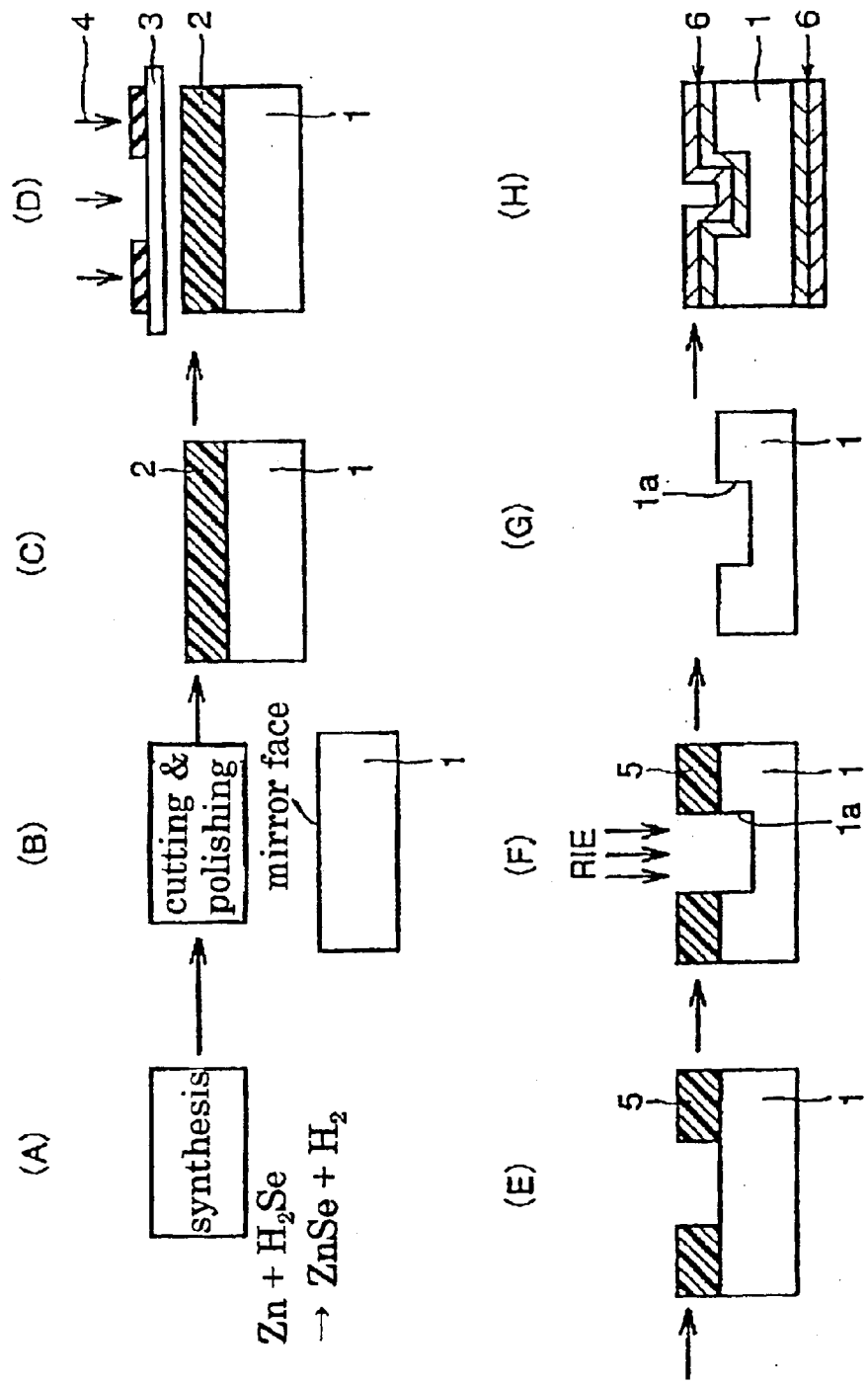
FIG. 8 is a diagram showing general steps in the DOE manufacturing using ZnSe polycrystals.
Figure 9:
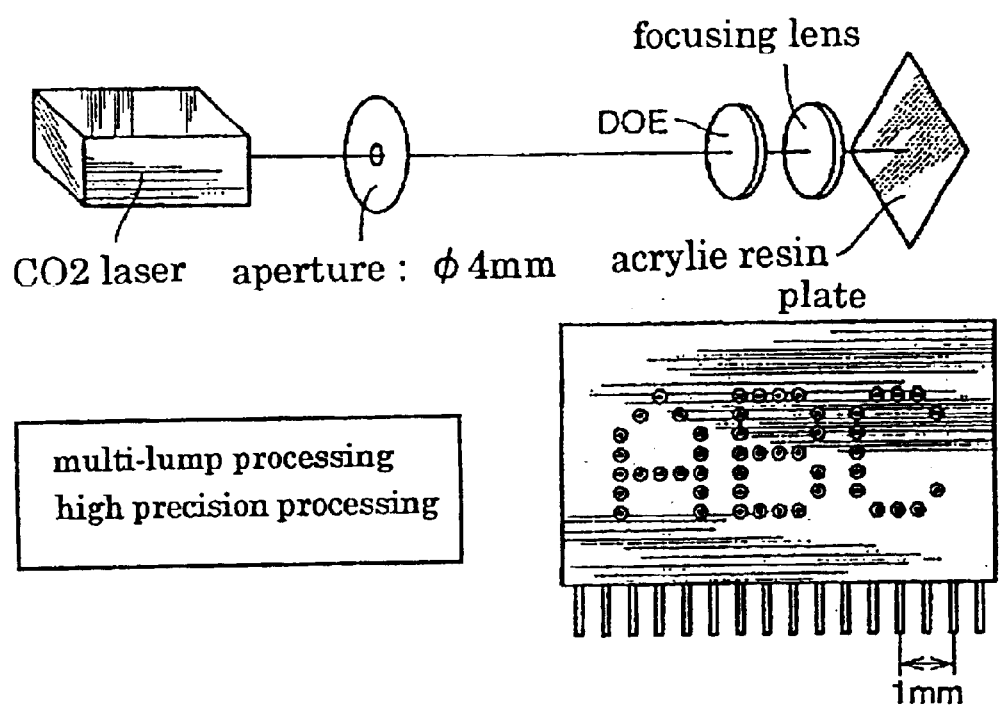
FIG. 9 is a view illustrating the applicability of DOE to laser drill processing.
Figure 10:
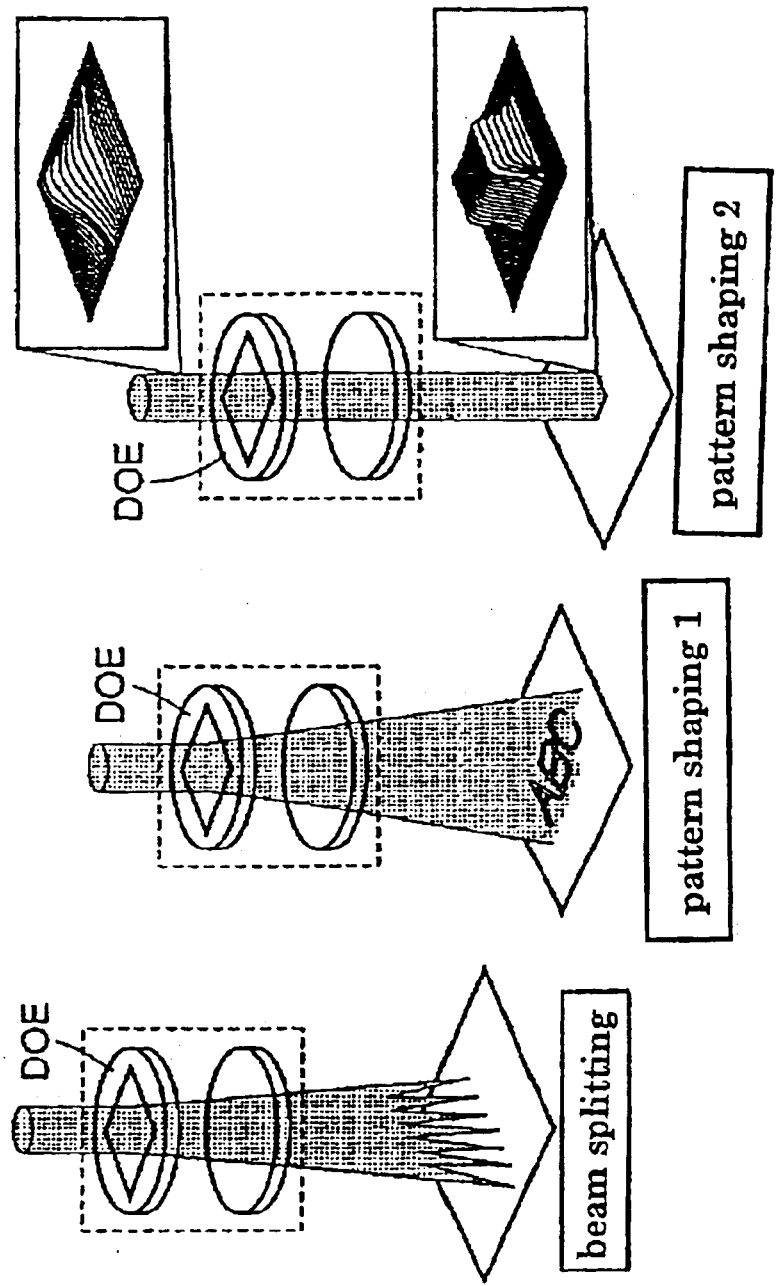
FIG. 10 is a view illustrating the applicability of DOE to other laser processing including the laser drill processing.
Figure 11:
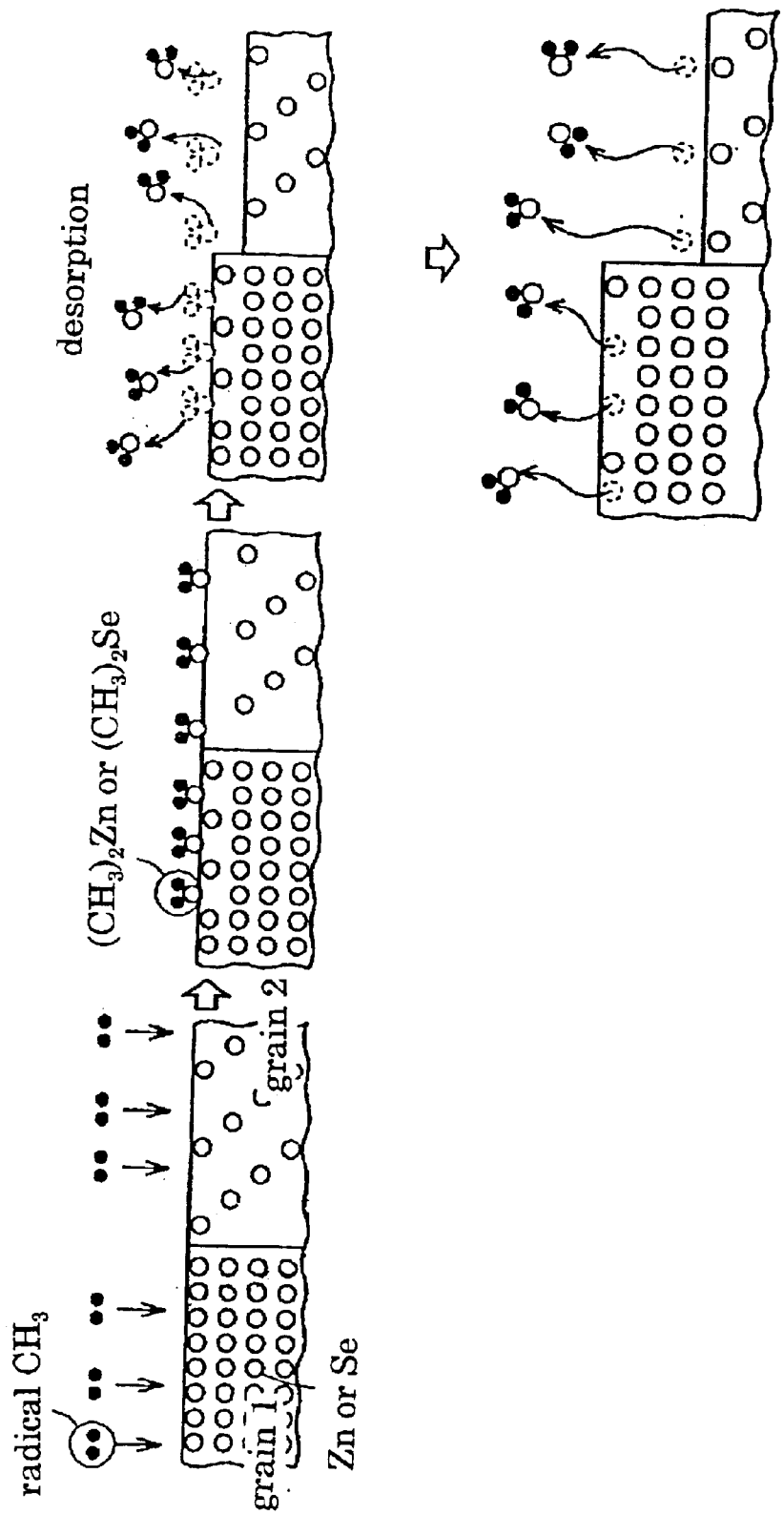
FIG. 11 is a view showing an assumable mechanism of the prior etching using hydrocarbon-based gas.
Figure 12:
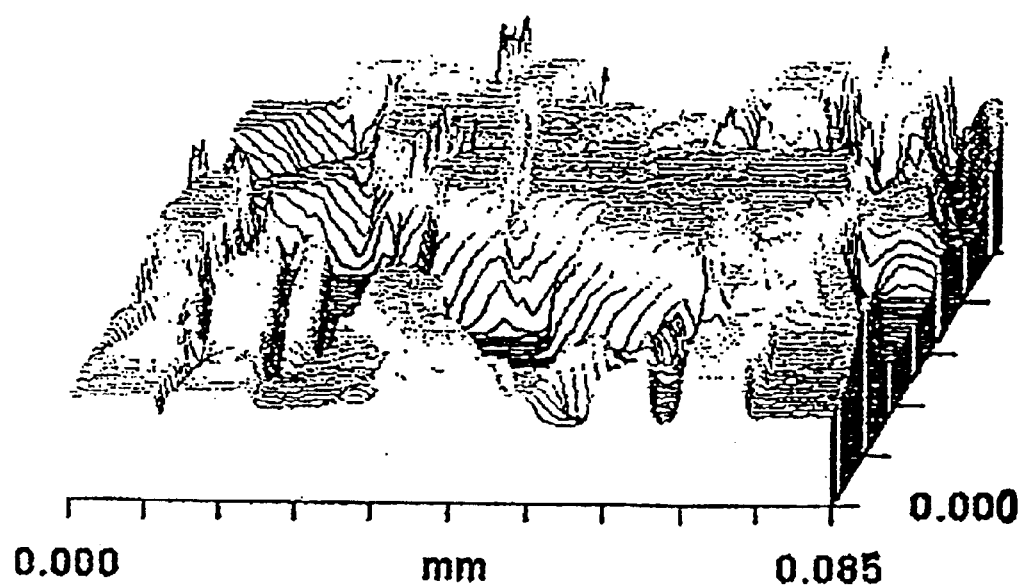
FIG. 12 is a view showing a surface condition obtained by the prior etching method.

What is claimed is:

1. A method of fabricating a diffractive optical element (DOE), the method comprising:
    reactive ion etching a pattern in a ZnSe polycrystalline substrate using a gas consisting of a chlorine-based gas which does not include a hydrocarbon group; and
    forming the DOE from the etched ZnSe polycrystalline substrate.

2. The method according to claim 1, wherein said chlorine-based gas includes $BCl_3$ gas.

3. The method according to claim 1, comprising reactive ion etching at a gas pressure of 0.5 Pa through 1 Pa.

4. The method according to claim 1, comprising activating the gas by means of a radio frequency.

5. The method according to claim 1, comprising:

synthesizing polycrystalline ZnSe from Zn and $H_2Se$; and cutting the ZnSe polycrystalline substrate out of the synthesized polycrystalline ZnSe, wherein the DOE is for a $CO_2$ gas laser.

6. A method of fabricating a Diffractive Optical Element (DOE), the method comprising:

reactive ion etching a pattern in a ZnSe polycrystalline substrate using a gas consisting of a chlorine-based gas which does not include a hydrocarbon group and inert gas or gas which does not react with ZnSe; and forming the DOE from the etched ZuSe polycrystalline substrate.

7. The method according to claim 6, wherein said chlorine-based gas includes $BCl_3$ gas.

8. The method according to claim 6 comprising reactive ion etching at a gas pressure of 0.5 Pa a through 1 Pa.

9. The method according to claim 6 comprising activating the gas by means of a radio frequency.

10. The method according to claim 6, wherein said inert gas includes Ar.

11. The method according to claim 10, wherein said chlorine-based gas includes $BCl_3$ gas.

12. The method according to claim 10 comprising reactive ion etching at a gas pressure of 0.5 Pa through 1 Pa.

13. The method according to claim 10 comprising activating the gas by means of a radio frequency.

* * * * *